(12) United States Patent
Harikrishna Mohan et al.

(10) Patent No.: US 11,751,426 B2
(45) Date of Patent: Sep. 5, 2023

(54) HYBRID THIN FILM PERMEATION BARRIER AND METHOD OF MAKING THE SAME

(71) Applicant: Universal Display Corporation, Ewing, NJ (US)

(72) Inventors: Siddharth Harikrishna Mohan, Plainsboro, NJ (US); William E. Quinn, Whitehouse Station, NJ (US); Arpit Patel, Piscataway, NJ (US); James Robert Kantor, Belle Mead, NJ (US)

(73) Assignee: Universal Display Corporation, Ewing, NJ (US)

( * ) Notice: Subject to any disclaimer, the term of this patent is extended or adjusted under 35 U.S.C. 154(b) by 44 days.

(21) Appl. No.: 15/787,117

(22) Filed: Oct. 18, 2017

(65) Prior Publication Data

US 2018/0108865 A1  Apr. 19, 2018

Related U.S. Application Data

(60) Provisional application No. 62/409,481, filed on Oct. 18, 2016.

(51) Int. Cl.
*H10K 50/844* (2023.01)
*H10K 71/00* (2023.01)
*H10K 77/10* (2023.01)
*H10K 102/00* (2023.01)

(52) U.S. Cl.
CPC ......... *H10K 50/8445* (2023.02); *H10K 71/00* (2023.02); *H10K 77/111* (2023.02); *H10K 2102/311* (2023.02); *H10K 2102/351* (2023.02); *Y02E 10/549* (2013.01)

(58) Field of Classification Search
CPC . H01L 51/5256; H01L 51/0097; H01L 51/56; H01L 2251/558; H01L 2251/5338
See application file for complete search history.

(56) References Cited

U.S. PATENT DOCUMENTS

| 4,769,292 A | 9/1988 | Tang et al. |
| 5,247,190 A | 9/1993 | Friend et al. |
| 5,703,436 A | 12/1997 | Forrest et al. |

(Continued)

FOREIGN PATENT DOCUMENTS

| CN | 1302254 A | 7/2001 |
| CN | 105679964 * | 6/2016 |

(Continued)

OTHER PUBLICATIONS

Machine translated document (Year: 2011).*

(Continued)

*Primary Examiner* — Ahmed N Sefer
(74) *Attorney, Agent, or Firm* — BUTZEL LONG

(57) ABSTRACT

A hybrid permeation barrier having two complementary layers is disclosed. The barrier includes a first layer with a relatively high stress-thickness in the range of −1000 MPa-μm to −200 MPa-μm and a second layer with a relatively low stress-thickness in the range −150 MPa-μm to 300 MPa-μm. The second layer compensates for the stress caused by the first, thereby allowing for a barrier that provides good permeation without causing failure of the device due to delamination.

21 Claims, 8 Drawing Sheets

(56) References Cited

U.S. PATENT DOCUMENTS

| | | |
|---|---|---|
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,268,695 B1 | 7/2001 | Affinito |
| 6,294,398 B1 | 9/2001 | Kim et al. |
| 6,303,238 B1 | 10/2001 | Thompson et al. |
| 6,337,102 B1 | 1/2002 | Forrest et al. |
| 6,413,645 B1 | 7/2002 | Graff et al. |
| 6,468,819 B1 | 10/2002 | Kim et al. |
| 6,570,325 B2 | 5/2003 | Graff et al. |
| 7,198,832 B2 | 4/2007 | Burrows et al. |
| 7,279,704 B2 | 10/2007 | Walters et al. |
| 7,431,968 B1 | 10/2008 | Shtein et al. |
| 7,968,146 B2 | 6/2011 | Wagner et al. |
| 2002/0153523 A1 | 10/2002 | Bernius |
| 2002/0172766 A1 | 11/2002 | Laxman et al. |
| 2003/0017718 A1 | 1/2003 | Aoi |
| 2003/0129298 A1* | 7/2003 | Tera .................. H10K 50/8445 313/506 |
| 2003/0230980 A1 | 12/2003 | Forrest et al. |
| 2004/0033373 A1 | 2/2004 | Rose et al. |
| 2004/0046497 A1 | 3/2004 | Schaepkens et al. |
| 2004/0174116 A1 | 9/2004 | Lu et al. |
| 2004/0218127 A1 | 11/2004 | Miura |
| 2005/0046341 A1 | 3/2005 | Ikeda et al. |
| 2005/0269943 A1* | 12/2005 | Hack .................. H01L 51/0097 313/504 |
| 2007/0020451 A1 | 1/2007 | Padiyath et al. |
| 2007/0105473 A1 | 5/2007 | Lee et al. |
| 2007/0108890 A1 | 5/2007 | Forrest |
| 2007/0159094 A1 | 7/2007 | Oh et al. |
| 2007/0181872 A1 | 8/2007 | Lee et al. |
| 2007/0269621 A1 | 11/2007 | Mitsuhashi et al. |
| 2008/0123073 A1* | 5/2008 | Shiraishi ................ B82Y 10/00 355/67 |
| 2008/0129189 A1 | 6/2008 | Cok |
| 2008/0237181 A1 | 10/2008 | Wagner |
| 2009/0039773 A1 | 2/2009 | Jun et al. |
| 2010/0143785 A1 | 6/2010 | Kwag et al. |
| 2010/0201256 A1 | 8/2010 | Xue et al. |
| 2010/0258821 A1 | 10/2010 | Forrest et al. |
| 2011/0032704 A1 | 2/2011 | Oh et al. |
| 2011/0049730 A1* | 3/2011 | Schmid ............. H01L 21/02274 257/E23.116 |
| 2011/0157540 A1 | 6/2011 | Jung et al. |
| 2011/0198597 A1 | 8/2011 | Antonenkov et al. |
| 2012/0007791 A1 | 1/2012 | Grbic et al. |
| 2012/0068162 A1* | 3/2012 | Mandlik ............. H01L 51/5253 257/40 |
| 2012/0161610 A1 | 6/2012 | Levermore |
| 2012/0181933 A1 | 7/2012 | Ma et al. |
| 2012/0205698 A1 | 8/2012 | Yamazaki et al. |
| 2012/0228668 A1* | 9/2012 | Thoumazet ......... C23C 16/0245 257/100 |
| 2012/0286302 A1* | 11/2012 | Mandlik ............. H01L 51/0097 257/88 |
| 2013/0202782 A1* | 8/2013 | Mandlik ................ H05B 33/10 427/66 |
| 2013/0210199 A1* | 8/2013 | Chen ...................... C23C 16/26 438/127 |
| 2013/0223016 A1 | 8/2013 | Kim et al. |
| 2013/0241076 A1 | 9/2013 | Mandlik et al. |
| 2013/0248867 A1 | 9/2013 | Kim et al. |
| 2013/0313547 A1* | 11/2013 | Nakano ............... H01L 51/5253 257/43 |
| 2013/0334511 A1* | 12/2013 | Savas ..................... H01L 51/56 257/40 |
| 2014/0077188 A1 | 3/2014 | Aonuma et al. |
| 2014/0087497 A1* | 3/2014 | Mandlik ............. H01L 51/5253 438/26 |
| 2014/0346535 A1 | 11/2014 | Son |
| 2014/0353625 A1 | 12/2014 | Yi et al. |
| 2014/0374704 A1 | 12/2014 | Jang et al. |
| 2015/0034916 A1 | 2/2015 | Lee et al. |
| 2015/0090995 A1* | 4/2015 | Jung .................. H01L 51/5253 257/40 |
| 2015/0137097 A1 | 5/2015 | Choi et al. |
| 2015/0159271 A1* | 6/2015 | Lee .................... C23C 16/45529 428/213 |
| 2015/0200315 A1 | 7/2015 | Mukai et al. |
| 2015/0284989 A1 | 10/2015 | Kim et al. |
| 2015/0357398 A1* | 12/2015 | Crook ............... H01L 21/02164 257/532 |
| 2016/0056414 A1* | 2/2016 | Harikrishna Mohan .................... H01L 51/0097 257/40 |
| 2016/0111684 A1* | 4/2016 | Savas ................ H01L 51/5256 257/40 |
| 2016/0254487 A1* | 9/2016 | Harikrishna Mohan .................... B32B 15/04 428/213 |
| 2017/0022963 A1 | 1/2017 | DeBenedictis |
| 2018/0153006 A1* | 5/2018 | Ishida ................ H01L 51/5203 |
| 2018/0269426 A1* | 9/2018 | Okamoto ........... H01L 51/5253 |

FOREIGN PATENT DOCUMENTS

| | | | |
|---|---|---|---|
| JP | 2004-65512 | * | 6/2004 |
| JP | 2011-199192 | * | 10/2011 |
| JP | 2014229854 | * | 12/2014 |
| WO | WO-2005051525 A1 | | 6/2005 |
| WO | WO-2008057394 A1 | | 5/2008 |
| WO | WO-2010011390 A2 | | 1/2010 |

OTHER PUBLICATIONS

Machine translated document (JP2004-65512) (Year: 2004).*
Baldo, "Highly efficient phosphorescent emission from organic electroluminescent devices," Nature, vol. 395, pp. 151-154, 1998.
Baldo, "Very high-efficiency green organic light-emitting devices based on electrophosphorescence," Applied Physics Letters, vol. 75, No. 1, pp. 4-6, Jul. 5, 1999.

* cited by examiner

FIG. 2
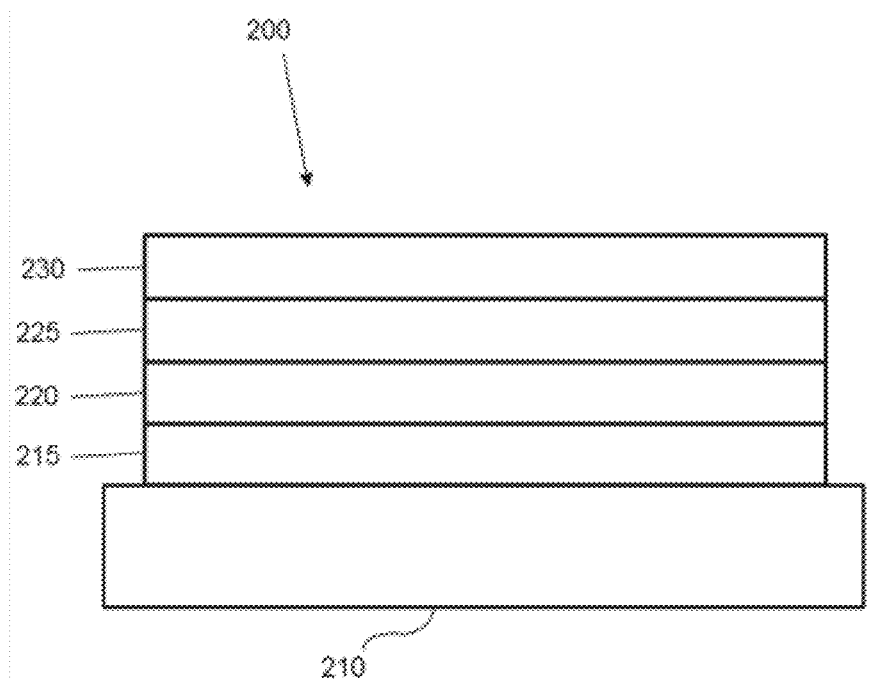
FIG. 3A
FIG. 3B
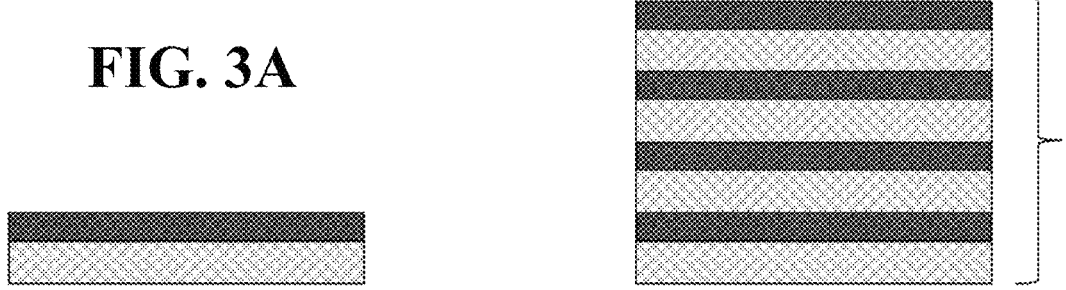
 HST Hybrid barrier
 LST Hybrid barrier Substrate HST Hybrid barrier LST Hybrid barrier

OLED

T = 0 hrs

T = 360 hrs

HYBRID THIN FILM PERMEATION BARRIER AND METHOD OF MAKING THE SAME

CROSS-REFERENCE TO RELATED APPLICATIONS

This application is a non-provisional of, and claims the priority benefit of U.S. Patent Application Ser. No. 62/409,481, filed Oct. 18, 2016, the entire contents of which are incorporated herein by reference.

FIELD

The present invention relates to barrier layers for use in encapsulating OLEDs and similar devices, and devices including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, a device is provided that includes a substrate; an OLED disposed over the substrate; a first layer disposed over the OLED and having a first stress-thickness product ST1 in the range −1000 MPa-μm to −200 MPa-μm; and a second layer disposed over the first layer and having a second stress-thickness product ST2 in the range −150 MPa-μm to 300 MPa-μm. The device may further include a third layer disposed over the second layer and having a third stress-thickness product ST3 in the range −1000 MPa-μm to −200 MPa-μm; and a fourth layer disposed over the third layer and having a second stress-thickness product ST4 in the range −150 MPa-μm and 300 MPa-μm. The OLED may be disposed over the third layer and the fourth layer, or all layers of the barrier may be disposed over the OLED. The layer disposed immediately over the OLED may encapsulate the OLED. The combined thickness of the first and second layers, or of all four layers, may be at least 4, 5, 8, or 10 μm. The second layer has a thickness of at least 5 or 10 times the thickness of the first layer. The stress-thickness product ST2 may be in the range 0 MPa-μm to 300 MPa-μm. The first layer may exert primarily a compressive stress on the OLED, and the second layer may exert primarily a neutral or tensile stress on the OLED.

In an embodiment, a permeation barrier is provided that includes a first layer having a first stress-thickness product ST1 in the range −1000 MPa-μm to −200 MPa-μm; and a second layer disposed over the first layer and having a second stress-thickness product ST2 in the range −150 MPa-μm to 300 MPa-μm. The barrier may further include a third layer disposed over the second layer and having a third stress-thickness product ST3 in the range −1000 MPa-μm to −200 MPa-μm; and a fourth layer disposed over the third layer and having a second stress-thickness product ST4 in the range −150 MPa-μm to 300 MPa-μm.

In an embodiment a method of encapsulating an electronic device is provided that includes depositing a first layer having a first thickness and a first stress-thickness product ST1 in the range −1000 MPa-μm to −200 MPa-μm over the electronic device, wherein the first layer extends beyond at least one edge of the device; selecting a second thickness of a second layer to be deposited over the first layer based at least in part upon ST1; and depositing the second layer having a second stress-thickness product ST2 in the range −150 MPa-μm and 300 MPa-μm over the first layer, wherein the second layer extends beyond the at least one edge of the device. The thickness of the first layer may be chosen to provide a desired barrier property. The first layer may extend beyond the at least one edge of the device by at least about 1 μm, and/or by not more than about 50,000 μm. The method may further include depositing a third layer having a third stress-thickness product ST3 in the range −1000 MPa-μm to 0 MPa-μm over the second layer; and depositing a fourth layer having a fourth stress-thickness product ST4 in the range −150 MPa-μm and 300 MPa-μm over the third layer. The thickness of the first layer may be selected based upon the composition of the electronic device.

BRIEF DESCRIPTION OF THE DRAWINGS

FIG. 2 shows an inverted organic light emitting device that does not have a separate electron transport layer.

FIG. 3A shows a cross section of a bilayer permeation barrier system according to an embodiment.

FIG. 3B shows a schematic cross section of n bilayers permeation barrier system according to an embodiment.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
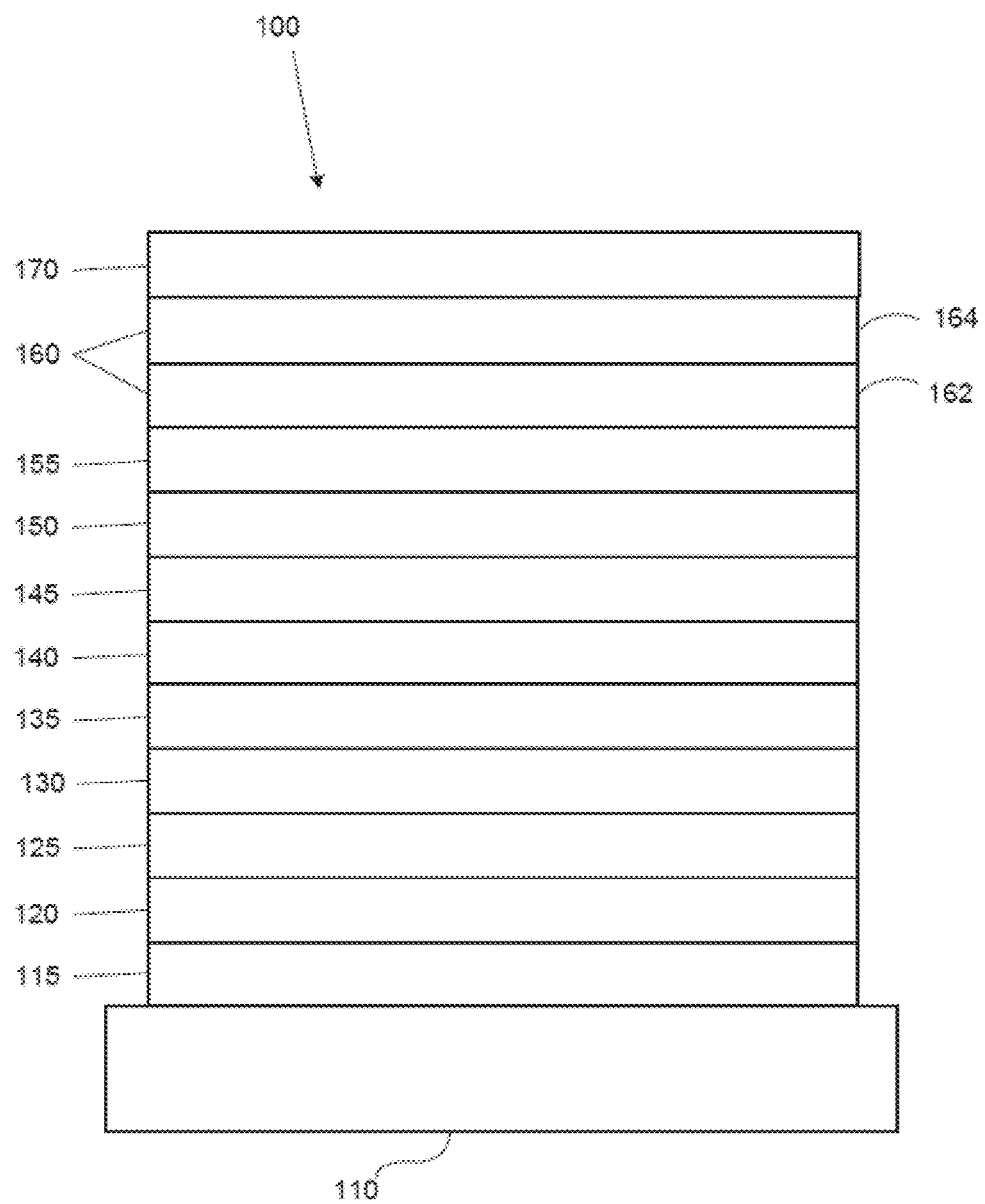
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

Organic light-emitting diode (OLED) displays and lighting panels need reliable protection from atmospheric gases, in particular moisture and oxygen. Many chemically-reactive low work function metals that are often used as electrodes are unstable in the presence of these species and can delaminate from the underlying organic layer. Similarly, commonly-used organic emitting materials can form non-emissive quenching species upon exposure to water. Conventionally, protection is provided by encapsulating the OLEDs and a desiccant between two glass plates, which are sealed around the edge with an adhesive. This traditional encapsulation method makes the device rigid and hence cannot be used for encapsulating flexible OLEDs. To make OLED displays flexible and lightweight, thin flexible barrier films may be used instead of rigid glass plates.

Polymeric substrates such as poly ethylene terephthalate (PET), poly ethylene naphthalate (PEN), and the like that are used to fabricate flexible OLEDs inherently have poor moisture barrier properties. For example, the water vapor transmission rate (WVTR) of a 100 μm thick PET layer is approximately 3.9 and 17 g/m$^2$/day at 37.8 C and 40 C, respectively. The most widely quoted value for required water vapor transmission rate (WVTR) for an OLED lifetime of 10,000 hours is 10$^{-6}$ g/m$^2$/day. Similarly, the required oxygen transmission rate (OTR) for similar lifetime has been reported as anywhere from 10$^{-5}$ cm$^3$/m$^2$/day to 10$^{-3}$ cm$^3$/m$^2$/day. Further, at least one surface of the display should be protected with a barrier film that is transparent, to transmit the light generated by the OLEDs. When coated over OLEDs, it is desirable that the barrier film is deposited at or near room temperature, because high temperatures will damage the OLEDs. Although many inorganic materials such as $SiN_x$, $SiO_2$ and $Al_2O_3$ have relatively low permeability for atmospheric gases, making transparent encapsulant barrier films from inorganic oxides and nitrides has proven to be difficult as they become permeable when deposited as thin films at near room temperature. First, single inorganic barrier layers contain microscopic defects when deposited at room temperature. These defects form pathways for permeation of atmospheric gases including water vapor. Secondly, inorganic thin films (barrier layers) such as $SiO_x$, $SiN_x$ or $SiO_xN_y$, develop self-relief microcracks once they reach a critical thickness, which ultimately limits the permeation barrier properties.

Flexible thin film barriers have been previously demonstrated as encapsulants for substrates and electronics devices. U.S. Pat. Nos. 6,268,695 and 6,413,645 teach the use of "multiple" barrier stacks to encapsulate moisture sensitive devices (such as OLEDs) and substrates. Each barrier stack pair, or "dyad," includes an inorganic material/polymer layer pair. The inorganic layer generally serves as the barrier layer, typically a metal oxide such as $Al_2O_3$, which has low permeability for atmospheric gases. Polycrystalline $Al_2O_3$ is usually deposited by reactive sputtering at room temperature. However, the resulting films often contain microscopic defects such as pinholes, cracks, and grain boundaries that eventually form pathways for permeation of atmospheric gases including water vapor. The polymer layer is usually a polyacrylate material, which is deposited by flash evaporation of a liquid acrylate monomer that is subsequently cured by UV radiation or an electron beam. This polymer layer mechanically decouples the "defects" in neighboring inorganic layers, for example as disclosed in U.S. Pat. No. 6,570,325. By using multiple dyads (usually around 3 to 5 dyads, i.e., 6 to 10 layers), such barrier films may protect the underlying device by mechanically de-coupling the rigid inorganic layers from each other and by forcing long permeation paths on water and oxygen, so that these molecules take long times to reach the OLED. Although such a technique may provide a long lag time for top-down diffusion of water vapor through the dyads, it fails to address the lateral/edge diffusion of water vapor when used to directly encapsulate OLEDs. Since the polymer/decoupling layer has a high diffusion co-efficient for water vapor, a very wide edge seal is required for protection. One way to reduce the edge seal width is disclosed in U.S. Pat. No. 7,198,832. In this technique, within a given barrier stack, the area of the inorganic barrier layer is made larger than the area of the decoupling, i.e., the polymer layer.

Subsequently, the area of the second barrier stack needs to be larger than the area of the first barrier stack and so on. By adopting this structure, the barrier layer can provide protection against lateral/edge diffusion of water vapor and oxygen.

Another, more successful technique to address these issues is the use of a $SiO_xC_yH_z$ hybrid barrier layer grown by plasma enhanced chemical vapor deposition (PECVD) of an organic precursor with a reactive gas such as oxygen, e.g., $HMDSO/O_2$. The barrier coating process is described in U.S. Pat. No. 7,968,146, the disclosure of which is incorporated by reference in its entirety. Such a barrier film is highly impermeable yet flexible. This material is a hybrid of inorganic $SiO_2$ and polymeric silicone and is deposited at room temperature. The barrier film has permeation and optical properties of glass, but with a partial polymer character that gives thin barrier films flexibility. That is, such a layer generally may achieve a WVTR of $10^{-6}$ g/m²/day or less and/or an OTR of $10^{-3}$ cm³/m²/day or less.

In certain types of equipment configurations; a hybrid layer with very good permeation barrier properties may have a relatively high built-in compressive stress, while a hybrid layer with somewhat moderate permeation barrier property may have a much smaller value of compressive stress or even tensile stress. High values of tensile stress or compressive stress are disadvantageous when depositing barrier films on OLEDs made on glass, steel foil or plastic substrates. Excessive tensile stress (positive) may fracture the barrier film and the underlying device, whereas excessive compressive stress (negative) may lead to buckling delamination.

The total mismatched stress in thin films deposited by PECVD results from primarily three factors: (1) the disordered structure of films and incorporation of certain species in films; (2) the difference in thermal expansion coefficients (CTE) of the film and the substrate; and (3) the difference in humidity expansion coefficients (CHE) of the film and the substrate.

The mismatched stress generates a mismatched strain between the thin film and the substrate. The primary components of the mismatched strain ($\varepsilon_M$) are (1) built-in strain ($\varepsilon_{bi}$), (2) thermal strain ($\varepsilon_{th}$), and (3) humidity strain ($\varepsilon_h$):

$$\varepsilon_M = \varepsilon_{bi} + \varepsilon_{th} + \varepsilon_h \quad (1)$$

The built-in strain ($\varepsilon_{bi}$) depends on the material system and the deposition conditions. In PE-CVD, the reactive species get inserted in to the film continuously. This process can be viewed as a wedging process. The built-in strain depends on the frequency and the size and type of the inserting species. Both these factors are determined by the process conditions.

The thermal strain ($\varepsilon_{th}$) develops when the film is deposited at an elevated temperature and then is brought down to the room temperature. The thermal strain ($\varepsilon_{th}$) is given by $$\varepsilon_{th} = (\alpha_f - \alpha_s) \times (T_{dep} - T_{room}) \quad (2)$$

where $\alpha_f$ and $\alpha_s$ are the CTEs of the film and the substrate. The humidity strain ($\varepsilon_h$) is given by $$\varepsilon_h = -(\beta_f - \beta_s) \times \% \ RH, \quad (3)$$

where $\beta_f$ and $\beta_s$ are the CHEs of the film and the substrate and % RH is the relative humidity.

In response to the mismatched strain, the film-on-substrate structure deforms. The deformation of the structure depends on the Young's modulus (Y) and thickness of the film (d) and the substrate. The product of the Young's modulus and the thickness (Y·d) decides the relative mechanical strengths of the film and the substrate. When $Y_s \cdot d_s \gg Y_f \cdot d_f$, the substrate dominates and the film complies. This is the case when thin films are deposited on rigid substrates like glass or Si. As a result, biaxial stress arises in the film causing the structure to bend in the form of a spherical cap with large radius of curvature (R) which can be described by the Stoney equation (Eq. 4):

$$R = \frac{Y_S^*}{6\varepsilon_M Y_f^*} \frac{d_S^2}{d_f}$$

where $Y_S^*$ and $Y_f^*$ are the biaxial elastic moduli of substrate and film. When the thickness of the film $d_f \ll d_S$, the stress of the film (S) can be approximated by:

$$S = \frac{Y_S^*}{6K} \frac{d_S^2}{d_f}$$

where K=(1/R) is the change in the curvature. The radius of curvature R is considered positive when the film faces inward, i.e., the film is under tensile strain and negative when the film is under compressive strain.

Similarly, the average stress of multilayer films is given by:

$$S_{ave} = \frac{S_1 T_1 + S_2 T_2 + \ldots S_n T_n}{T_1 + T_2 + \ldots T_n}$$

where $S_1, S_2 \ldots S_n$: are the stress of the individual thin films and $T_1, T_2 \ldots T_n$ are the respective thicknesses of the individual thin films.

In addition to reducing or limiting the stresses experienced by the films, when directly encapsulating OLEDs by depositing thin film barriers, it also may be desirable to cover relatively small particles and defects that act as potential weak spots for moisture and oxygen ingress. For example, in a 300 dpi high resolution display, a particle size of 10 μm can cover about 10% of the active area of a sub pixel. Smaller particles of less than 5 μm diameter may be generated during TFT backplane processing steps. One way to obtain particle coverage is by growing relatively thick films to fully encapsulate the particle, such as films that are sufficiently thick to cover the relevant particle size, e.g. at least 5, 8, or 10 μm thick. By PECVD deposition conformable coating of the substrate, including roughness, profiles, and particles can be obtained. The thickness of barrier layer may be chosen based on the maximum particle size that needs to be effectively encapsulated while still providing desired stress properties for the film or combination of films. For example, if it is desired to effectively encapsulate a 5 μm particle, a minimum barrier thickness of 5 μm may be required. To grow relatively thick layers and still retain the desired permeation barrier property, it may be necessary to precisely control the overall stress. Accordingly, it may be important to obtain a stress-thickness product value that is below certain threshold limits to avoid stress induced defects. Further, it may be preferable that the stress balance be achieved while depositing the barrier material from the same precursor material. Accordingly, improved barrier structure and methods of making the same are needed.

Disclosed herein is a hybrid thin film permeation barrier structure for substrates and devices. The permeation barrier structure includes one or more bilayers of a hybrid permeation barrier material. Each of the one or more bilayers includes a first barrier layer having a stress-thickness product value between −1000 MPa-μm and −200 MPa-μm and a second barrier layer having a stress-thickness product value between −150 MPa-μm and +300 MPa-μm. The overall stress thickness product at any point during the deposition is between −1000 MPa-μm and +300 MPa-μm. Such a structure may provide a relatively thick, stress controlled, permeation barrier with WVTR and OTR values suitable for use with flexible OLEDs, which can also encapsulate micron sized particles.

A permeation barrier structure as disclosed herein includes one or more bilayers of a hybrid permeation barrier, such as a $SiO_xC_yH_z$ thin film permeation barrier. FIG. 3A shows the basic bilayer barrier structure. The bottom layer, labeled HST, has a stress-thickness product ST1 between −1000 MPa-μm and −200 MPa-μm. The upper layer, labeled LST, has a stress-thickness product ST2 between −150 MPa-μm and +300 MPa-μm. The overall stress thickness product at any point during deposition may be between −1000 MPa-μm and +300 MPa-μm. As described herein, the stress-thickness product of each layer and during deposition may be selected and controlled based upon the deposition parameters used. FIG. 3B shows an embodiment having n bilayer barrier stacks. By stacking one or more bilayers, the stress-thickness product value can be kept within critical bounds and a relatively thick permeation barrier can be made without any stress-induced defects such as delamination, buckling or cracks.

Figure 4:
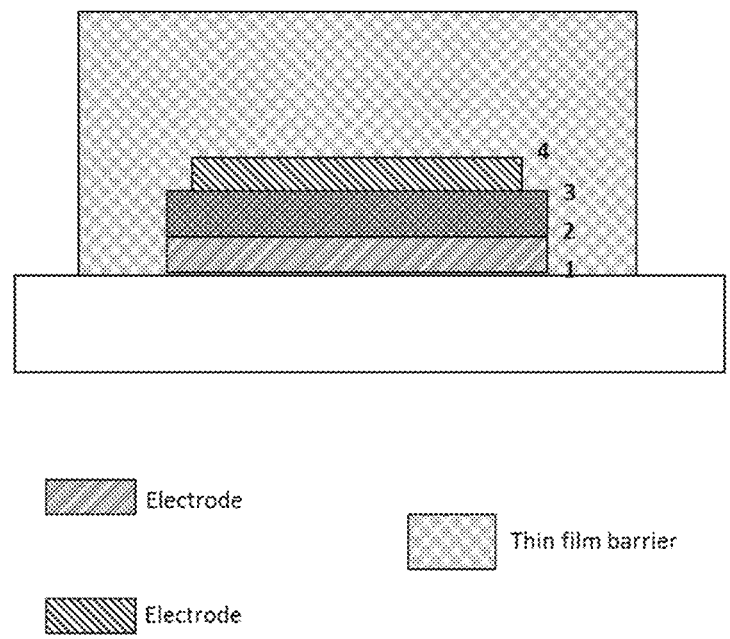
FIG. 4 shows a cross-section view of an OLED encapsulated with a thin film barrier according to an embodiment.

When growing relatively thick barrier layers on OLEDs and to retain the permeation barrier property, it is desirable to control and balance the overall stress of the system. To illustrate why this is the case, a schematic cross section view of an OLED encapsulated with a thin film barrier may be considered, as shown in FIG. 4. The substrate may be rigid (glass, silicon etc.) or flexible (PET, PEN, polyimide, thin glass or metal foil). The first electrode typically is usually the anode made of a transparent conductive oxide such as ITO or IZO, though similar concerns are present in devices having the cathode adjacent to the substrate. The organic stack includes one or more layers of small/polymer molecules and the cathode is typically a metal such as Aluminum, Mg:Ag or the like. Typical structures of organic stacks and OLEDs are described in further detail with respect to FIGS. 1 and 2; the simplified structure shown in FIG. 4 is provided for illustration of the relevant and relative stresses involved. A thin film barrier may be disposed over the device, typically so as to encapsulate the device by sealing each edge and surface of the device other than the surface in contact with the substrate, although in some cases the substrate also may be encapsulated. The different interfaces in this structure are: substrate-anode (1); anode-organic (2); organic-cathode (3); and cathode-barrier (4). Typically, the organic-cathode adhesion is very weak and therefore interface 3 is the weakest compared to 1, 2, and 4. If a highly compressive barrier is deposited on top of the cathode and if the adhesion of the barrier to the cathode is relatively high, then a compressive force is exerted on the device. There exists a critical value of this force beyond which the cathode and barrier delaminate from the underlying organic stack. It therefore is desirable for the total force or the stress-thickness (ST) product value, to be below certain threshold limits to avoid stress induced defects. For example, in many embodiments it may be desirable for the magnitude of the total stress-thickness product of the thin film barrier to be not more than 1000 MPa-μm.

If the deposition of the hybrid thin film permeation barrier is performed close to room temperature and the stress is measured immediately after deposition or measured in a humidity free environment (i.e: minimal thermal and humidity induced stress); then the total stress is predominantly the built-in stress. The built-in stress and hence the built-in strain can be changed by varying the deposition parameters such as precursor flow rate, reactive gas flow rate, deposition power, process pressure, frequency of discharge or a combination of these.

Table 1 shows an example of how the stress (S) and stress thickness product (ST) can be tuned by varying deposition parameters for the thin film. To perform the stress experiments, bare 2″ silicon wafers (300 um thick) were used as substrates. Wafer curvatures were measured by scanning the wafer using a KLA-Tencor P-6 profilometer prior to deposition. Films A through F were then deposited on to the pre-mapped wafers by PECVD using HMDSO and oxygen. The wafers were subsequently post-mapped using the same recipe to measure the change in curvature and the stress was evaluated according to Stoney's law.

TABLE 1

| Film | HMDSO Flow Rate (sccm) | Oxygen Flow Rate (sccm) | RF Power (Watts) | Pressure (Pa) | Stress (S) (MPa) | Thickness (T) (um) | Stress * Thickness (ST) (MPa um) |
|---|---|---|---|---|---|---|---|
| A | 10.8 | 130 | 250 | 15 | −335 | 3.0 | −995 |
| B | 12.4 | 130 | 250 | 15 | −227 | 3.0 | −681 |
| C | 13.5 | 130 | 250 | 15 | −205 | 3.0 | −617 |
| D | 15.1 | 130 | 250 | 15 | −191 | 3.0 | −573 |
| E | 16.5 | 130 | 250 | 15 | −167 | 3.0 | −502 |
| F | 4.5 | 55 | 150 | 30 | 13 | 5.0 | +65 |

As seen, a wide range of stress and stress-thickness (ST) may be obtained by varying the deposition conditions. Films A through E are deposited at the same RF Power and the thickness is equal to 3 μm. Film A is highly stressed with a ST value of −995 MPa-μm. If the same film was grown on an OLED device and made thicker, the film would delaminate by buckling due to excessive compressive stress. However, according to the embodiments of the invention, a 3 μm thick first layer having an ST of −995 MPa-μm (similar to Film A) may be deposited, and a second 5 μm thick layer having an ST of +65 MPa-μm may be deposited (similar to Film F). The overall thickness of the permeation barrier is then 8 μm and the overall ST −930 MPa-μm, i.e., the sum of the individual ST values (−995+65=−930 MPa-μm).

Alternatively, it may be beneficial to use multiple thin bilayers of Film A and Film F to achieve the same thickness. Such a structure may be preferred, for example, for encapsulating OLEDs and performing accelerated shelf life aging studies. For example, a 0.06 μm layer of Film A and a 0.14 μm layer of Film B may be alternatively stacked to reach a desired thickness. The ST after the first bilayer deposition is 0.06×−335+0.14×13=−18.3 MPa-μm. The ST after the second bilayer stack deposition is (−18.3)+(−18.3)=−36.6 MPa-μm, and so on. The ST after a total deposition of 8 μm would then be −732 MPa-μm. Such a total stress value should be sufficient to prevent delamination and other undesirable effects commonly observed in conventional barrier layers.

Figure 5:
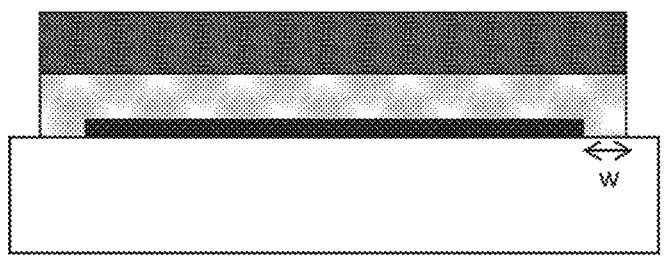
FIG. 5 shows a cross-section view of an OLED encapsulated with a bilayer permeation barrier system according to an embodiment.
Figure 5:
Figure 5:
Figure 5:
Figure 5:

FIG. 5 shows an example device according to an embodiment of the invention. An environmentally sensitive device, such as an OLED or other display or lighting device is placed on the substrate. The device may be fabricated on the substrate by deposition, such as vacuum deposition, or it may be obtained separately from or already disposed on the substrate. A first hybrid barrier layer having a stress-thickness product ST1 between −1000 MPa-μm and −200 MPa-μm is deposited over the OLED. The footprint of the first hybrid barrier layer extends beyond the edge of the OLED by a bezel width w. That is, the hybrid barrier layer extends beyond the OLED on each edge by the bezel width. The bezel width w may be any desired value, for example, between 1 μm to 50000 μm. A second barrier layer having stress-thickness product of ST2 between −150 MPa-μm and +300 MPa-μm is then deposited over the first hybrid barrier layer. As previously disclosed, the stress-thickness product of each individual layer in the hybrid permeation barrier as well as the total stress-thickness of the hybrid barrier may be controlled by selecting suitable deposition parameters.

Figure 6:
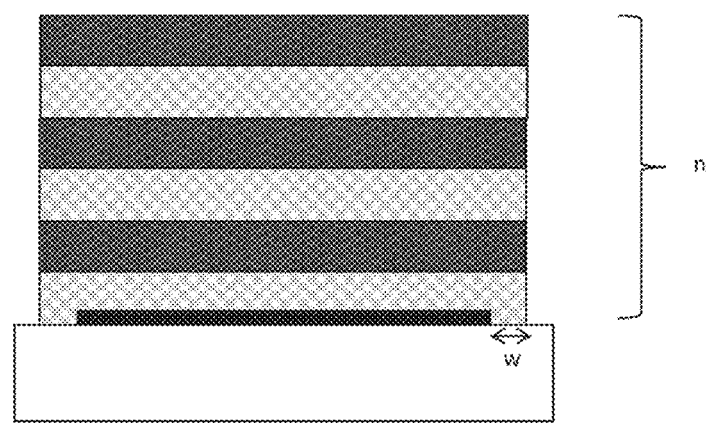
FIG. 6 shows a cross-section view of an OLED encapsulated with multiple bilayer permeation barrier units according to an embodiment.
Figure 6:
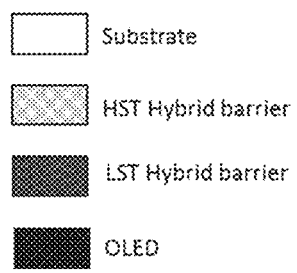

Alternatively, multiple bilayer stacks may be used to encapsulate the OLED device. For example, FIG. 6 shows an embodiment in which n bilayer stacks are disposed over the OLED device to encapsulate it in the same arrangement as shown in FIG. 5. In this configuration, the pair of a first hybrid barrier layer having a stress-thickness product ST1 of −1000 MPa-μm to 0 MPa-μm and a second barrier layer having stress-thickness product ST2 of −150 MPa-μm to +300 MPa-μm and so forth, is repeated n times over the OLED or similar device. Notably, because the stress-thickness product is used as the controlling metric for each layer and for the barrier layer stack as a whole, the stress or the thickness of the individual layers may be changed as long as the total ST value is within the range: For example, a multi-layer hybrid permeation barrier stack may be used in which $S_1$=−300 MPa, $T_1$=0.5 μm, $S_2$=+10 MPa, $T_2$=1 μm, $S_3$=−250 MPa, $T_3$=0.5 μm, $S_4$=+20 MPa, $T_4$=0.5 μm. In some embodiments, OLEDs such as shown in FIGS. 4 and 5 may be grown on non-polymeric substrates substrate such as glass, silicon or metal foil. OLEDs grown on such substrates do not require moisture protection on the bottom.

Figure 7:
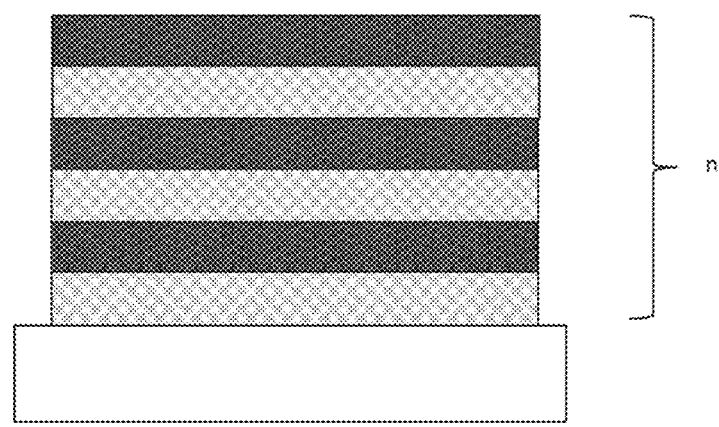
FIG. 7 shows a cross-section view of a flexible substrate encapsulated with multiple bilayer permeation barrier units according to an embodiment.

FIG. 7 shows a bare polymeric substrate such as PET, PEN or polyimide encapsulated with n bilayer stacks. When the film and the substrate have comparable strengths, i.e., $Y_s \cdot d_s \approx Y_f \cdot d_f$, the simple Stoney equation does not apply. In this case the structure bends into a cylindrical roll whose radius of curvature, R is given by a very complicated expression, but for similar Poisson ratios for the substrate and the film it can be approximated by the Stoney equation (Eq. 5), $$\frac{1}{R} = \frac{6\varepsilon_M(1+\vartheta)Y_s Y_f d_f d_S(d_f + d_S)}{(Y_s d_S^2 - Y_f d_f^2)^2 + 4 Y_s Y_f d_f d_S(d_f + d_S)^2}$$

where 1/R is the change in the curvature K=1/R.

The built-in stress of the barrier film can be calculated by rearranging the Stoney equation (Eq. 5) and using it to calculate stress instead of strain. The modified equation provides the built-in stress as, $$S = \frac{Y_s d_S^2(d_f + d_S)}{6(1-\vartheta)d_f}\left[1 + \frac{d_f}{d_s}\left(\frac{4Y_f}{Y_s} - 1\right)\right]\left(\frac{1}{R}\right)$$

The total built-in stress and hence built-in strain in these films and in the total stack of n bilayer films can be changed by changing deposition parameters for one or more of the films.

Figure 8:
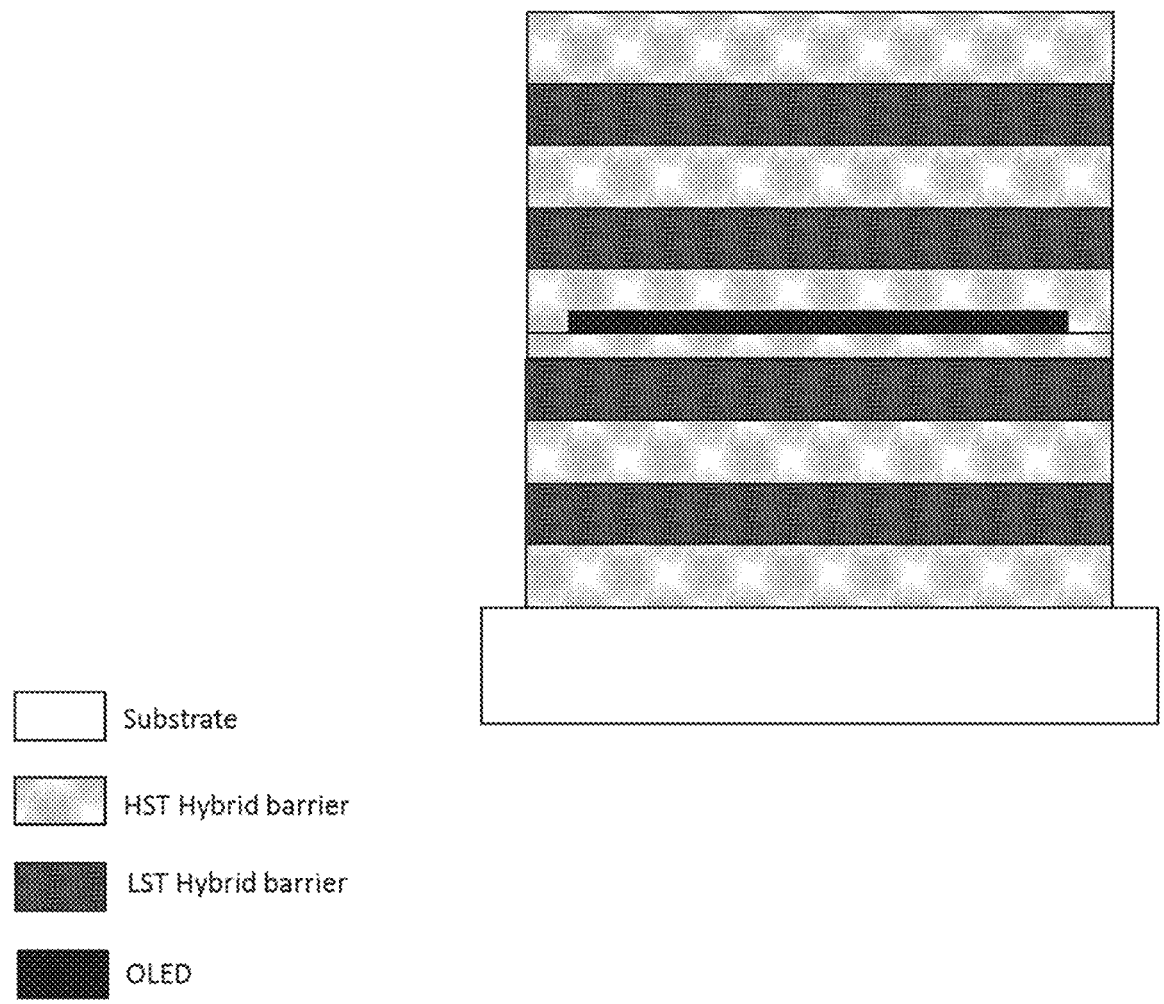
FIG. 8 shows a ross-section view of an OLED on flexible substrate encapsulated with multiple bilayer permeation barrier units according to an embodiment. The substrate may be encapsulated with multiple bilayer permeation barrier units prior to OLED growth.

In an embodiment, one or more bilayer thin film permeation barriers as previously disclosed may be arranged over and below an OLED or similar device. FIG. 8 shows an OLED device grown on a polymeric substrate. Prior to OLED deposition, the substrate is coated with a hybrid bilayer encapsulation barrier structure to provide adequate moisture protection as previously disclosed. An OLED is then fabricated on top of the barrier layers and the OLED is subsequently encapsulated with one or more hybrid permeation barriers disposed over, and encapsulating, the OLED. More specifically, a relatively high-ST layer (HST) as previously disclosed may be fabricated over and around the OLED, after which a relatively low-ST (LST) layer may be fabricated over the HST layer. Any number of such paired thin film layers may be fabricated over the OLED to achieve a desired ST value and/or a desired total thickness of the hybrid permeation barrier as previously disclosed.

In some embodiments, the relative thicknesses of the layers in a hybrid permeation barrier may be selected to achieve a desired stress-thickness product and/or a desired thickness. For example, the low stress-thickness layer may have a thickness of 5-10 times the thickness of the high stress-thickness layer. The combined thickness of the layers in a hybrid permeation barrier may be any desired thickness, such as 4, 5, 8, or 10 μm. As previously disclosed, the thickness may be selected to achieve encapsulation of various particulate matter as well as a desired total stress-thickness.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

EXPERIMENTAL

The performance of OLEDs encapsulated by a hybrid permeation barrier system as disclosed herein was tested. Three transparent OLED devices (devices A, B, C) with moisture sensitive Mg:Ag cathodes were grown on glass substrates. The devices were subsequently encapsulated with a $SiO_xC_yH_z$ hybrid barrier layers grown by plasma enhanced chemical vapor deposition (PECVD) of an $HMDSO/O_2$. The barrier coating process is described in U.S. Pat. No. 7,968,146. The effectiveness of the structure is demonstrated by growing thick layers. Hence a target thickness of the barrier is chosen to be 8 µm, which would allow encapsulation of particles up to 8 µm in diameter. The deposition conditions and the barrier structures for devices A, B, C are listed in Table Deposition Process Test:

Device A is a comparative device encapsulated by depositing discrete single layers of 0.085 µm thick highly compressive hybrid barrier (−335 MPa). The stress-thickness product after the first repetition is −20.1 MPa-µm (−335 MPa×0.085 µm). The stress-thickness product after the $2^{nd}$ repetition is −40.2 MPa-µm and so on. A 5 minute cooling step (no deposition) is included between deposition steps to keep the temperature of the substrate below 40 C to minimize the effect of thermal strain. Although the target thickness was 8 µm or (94 repetitions), the hybrid barrier and cathode delaminated from the underlying organic when the thickness reached 3 µm (after 35 repetitions). The ST product was ~−1005 MPa-µm. The delamination is likely due to compressive stress exerted on the device by the highly compressive barrier.

Device B is another comparative device encapsulated with a 8 µm thick tensile hybrid barrier. This is done by depositing discrete layers of 0.14 µm, 57 times and by including a 5 minute cooling step (no deposition) between deposition steps. The overall stress-thickness product (ST)=+104 MPa-µm. The comparative device remained intact after the barrier deposition process.

Device C is a device having a hybrid permeation barrier as disclosed herein. The permeation barrier structure includes one or more bilayers of hybrid permeation barrier. As described earlier, the bottom layer has a stress-thickness product ST1 between −1000 MPa-µm and −200 MPa-µm and top layer has a stress-thickness product of ST2 between −150 MPa-µm and +300 MPa-µm. The overall stress thickness product at any point during deposition is between −1000 MPa-µm and +30 MPa-µm. By stacking one or more bilayers, the stress-thickness product value can be kept within critical bounds and a relatively thick permeation barrier can be made without any stress induced defects such as delamination, buckling or cracks.

In Device C, a first layer of 0.06 µm high compressive stress hybrid barrier is deposited. Then, a second layer of 0.14 µm of a low tensile stress hybrid barrier is deposited. This bilayer unit is stacked 40 times to obtain a 8 µm thick barrier. A 5 minute cooling step (no deposition) between bilayer unit deposition steps is included. The overall stress-thickness product (ST)=−732 MPa-µm. The inventive device remained intact after the barrier deposition process.

Although many embodiments were described above as comprising different features and/or combination of features, a person of ordinary skill in the art after reading this disclosure may understand that in some instances, one or more of these components could be combined with any of the components or features described above. That is, one or more features from any embodiment can be combined with one or more features of any other embodiment without departing from the scope of the invention. As noted previously, all measurements, dimensions, and materials provided herein within the specification or within the figures are by way of example only. It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:
   a substrate;
   an organic light emitting diode (OLED) disposed over the substrate; and
   a permeation barrier comprising:
      a first layer disposed over the OLED and having a first stress-thickness product ST1 in the range −1000 MPa-µm to −200 MPa-µm; and
      a second layer disposed over the first layer and having a second stress-thickness product ST2 in the range −150 MPa-µm to 300 MPa-µm;

TABLE 2

| Device | Stress (S) (MPa) | Thickness/ repetition (T) (um) | Stress * Thickness (ST)/repetition (MPa um) | Target thickness (um) | Target Number of bilayer units 'n'/repetitions | Actual Number of bilayer units 'n'/repetitions | Actual thickness deposited (T) (um) | Overall Stress * Thickness (ST) (MPa um) | Results |
|---|---|---|---|---|---|---|---|---|---|
| A | −335 | 0.085 | −20.1 | 8 | 94 | 35 | 3 | −1005 | Delaminated |
| B | +13 | 0.14 | +1.8 | 8 | 57 | 57 | 8 | +104 | Pass |
| C | −335 | 0.06 | −20.1 | 8 | 40 | 40 | 8 | −732 | Pass |
|   | +13 | 0.14 | +1.8 |   |   |   |   |   |   |

High Temperature High Humidity Test (HTHH):

Devices B & C were then coated with a scratch protective polymer layer (a poor barrier). The devices were monitored at 85 C, 85% relative humidity (RH) over time.

Comparative device B catastrophically failed after 24 hours of HTHH testing. The barrier and cathode delaminated from the underlying organic stack. This is likely due to the stress change in the barrier film when water permeates. As the barrier film is inherently low stress the diffusion co-efficient of water in this film is expected to be higher than Film A. When water diffuses into the film, the film expands resulting in an increase in compressive stress or a reduction in tensile stress and eventually delamination.

Figure 9:
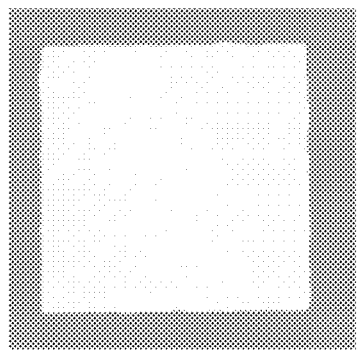
FIG. 9 shows images of lit up OLED pixels encapsulated with a barrier as disclosed herein at T=0 and T=360 hours.
Figure 9:
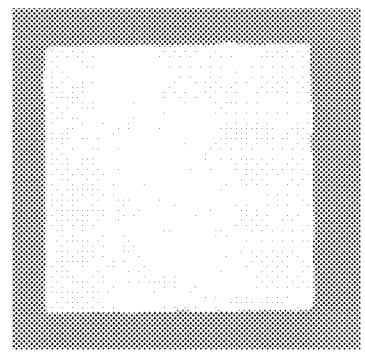

Device C with the bilayer unit stacks remain intact and dark spot free for 360 hours after which the barrier and cathode delaminated. FIG. 9 shows the image of the active pixels at T=0 and T=360 hours. The high stress layers in the bilayer stack have a low diffusion co-efficient for water and serve as effective barrier layers. The low stress layers in the bilayer stack act as buffer units to keep the stress thickness product of the bilayers below the threshold value.

wherein the second layer is immediately adjacent to and in direct physical contact with the first layer.

2. The device of claim 1, the permeation barrier further comprising:
   a third layer disposed over the second layer and having a third stress-thickness product ST3 in the range −1000 MPa-µm to −200 MPa-µm; and
   a fourth layer disposed over the third layer and having a fourth stress-thickness product ST4 in the range −150 MPa-µm and 300 MPa-µm.

3. The device of claim 1, further comprising
   a third layer disposed over the substrate and having a third stress-thickness product ST3 in the range −1000 MPa-µm to −200 MPa-µm; and
   a fourth layer disposed over the third layer and having a fourth stress-thickness product ST4 in the range −150 MPa-µm to 300 MPa-µm;
   wherein the OLED is disposed over the third layer and the fourth layer.

4. The device of claim 1, wherein the first layer encapsulates the OLED.

5. The device of claim 1, wherein the combined thickness of the first and second layers is at least 4 µm.

6. The device of claim 5, wherein the combined thickness of the first and second layers is at least 8 µm.

7. The device of claim 1, wherein the first layer has a thickness T and the second layer has a thickness of at least 5T.

8. The device of claim 7, wherein the first layer has a thickness T and the second layer has a thickness of at least 10T.

9. The device of claim 1, wherein ST2 is in the range 0 MPa-µm to 300 MPa-µm.

10. The device of claim 1, wherein the first layer exerts primarily a compressive stress on the OLED, and the second layer exerts primarily a neutral or tensile stress on the OLED.

11. The device of claim 1, wherein the device is flexible.

12. The device of claim 1, wherein the device comprises at least one selected from the group consisting of: a flat panel display, a computer monitor, a medical monitor, a television, a billboard, a light for interior or exterior illumination and/or signaling, a heads-up display, a fully or partially transparent display, a flexible display, a laser printer, a telephone, a cell phone, a tablet, a phablet, a personal digital assistant (PDA), a laptop computer, a digital camera, a camcorder, a viewfinder, a micro-display less than 2 inches diagonal, a 3-D display, a virtual reality or augmented reality display, a vehicle, a video wall comprising multiple displays tiled together, a theater or stadium screen, and a sign.

13. The device of claim 1, wherein the permeation barrier comprises not more than four layers.

14. The device of claim 1, wherein the permeation barrier has a total stress-thickness product in the range −1150 MPa-µm to −700 MPa-µm.

15. The device of claim 1, wherein the permeation barrier has a total stress-thickness product in the range −1000 MPa-µm and 300 MPa-µm.

16. A device comprising:
   a substrate;
   an organic light emitting diode (OLED) disposed over the substrate; and
   a first permeation barrier comprising:
      a first layer disposed over the OLED and having a first stress-thickness product ST1 in the range −1000 MPa-µm to −200 MPa-µm; and
      a second layer disposed over the first layer and having a second stress-thickness product ST2 in the range −150 MPa-µm to 300 MPa-µm;
   a second permeation barrier comprising:
      a third layer disposed over the substrate and having a third stress-thickness product ST3 in the range −1000 MPa-µm to −200 MPa-µm; and
      a fourth layer disposed over the third layer and having a fourth stress-thickness product ST4 in the range −150 MPa-µm to 300 MPa-µm;
   wherein the OLED is disposed over the third layer and the fourth layer.

17. The device of claim 16, the first permeation barrier further comprising:
   a fifth layer disposed over the second layer and having a fifth stress-thickness product ST5 in the range −1000 MPa-µm to −200 MPa-µm; and
   a sixth layer disposed over the fifth layer and having a sixth stress-thickness product ST6 in the range −150 MPa-µm and 300 MPa-µm.

18. The device of claim 16, wherein the first layer encapsulates the OLED.

19. The device of claim 16, wherein ST2 is in the range 0 MPa-µm to 300 MPa-µm.

20. The device of claim 16, wherein the device is flexible.

21. The device of claim 16, wherein the device comprises at least one selected from the group consisting of: a flat panel display, a computer monitor, a medical monitor, a television, a billboard, a light for interior or exterior illumination and/or signaling, a heads-up display, a fully or partially transparent display, a flexible display, a laser printer, a telephone, a cell phone, a tablet, a phablet, a personal digital assistant (PDA), a laptop computer, a digital camera, a camcorder, a viewfinder, a micro-display less than 2 inches diagonal, a 3-D display, a virtual reality or augmented reality display, a vehicle, a video wall comprising multiple displays tiled together, a theater or stadium screen, and a sign.

* * * * *